United States Patent [19]
Okuda et al.

[11] Patent Number: 5,865,319
[45] Date of Patent: Feb. 2, 1999

[54] AUTOMATIC TEST HANDLER SYSTEM FOR IC TESTER

[75] Inventors: Hiroshi Okuda, Tatebayashi; Shin Nemoto, Yono; Hisao Hayama, Gyoda; Katsumi Kojima, Hasuda, all of Japan

[73] Assignee: Advantest Corp., Tokyo, Japan

[21] Appl. No.: 671,331

[22] Filed: Jun. 27, 1996

[30] Foreign Application Priority Data

Dec. 28, 1994 [JP] Japan ...................................... 7-70826

[51] Int. Cl.⁶ .................................................. B07C 5/344
[52] U.S. Cl. ............................ 209/574; 209/571; 209/573
[58] Field of Search ..................................... 209/552, 571, 209/573, 574

[56] References Cited

U.S. PATENT DOCUMENTS

| | | | |
|---|---|---|---|
| 4,544,318 | 10/1985 | Nagatomo et al. | 198/346 |
| 4,805,759 | 2/1989 | Rochet et al. | 198/346.1 |
| 5,313,156 | 5/1994 | Klug et al. | 209/573 |
| 5,321,885 | 6/1994 | Hino et al. | 209/573 |

*Primary Examiner*—William E. Terrell
*Assistant Examiner*—Mark Deuble
*Attorney, Agent, or Firm*—Muramatsu & Associates

[57] ABSTRACT

An automatic test handler system for automatically supplying IC devices to be tested to an IC tester and sorting the tested IC devices based on the test results. The system includes a testing machine for testing the IC devices by contacting the IC devices with test contactors. Test signals are provided from the IC tester and the resulting signals from the IC devices are received. The testing machine is installed in a test room in which dust, temperature and humidity are controlled in a high degree. A sorting machine is installed outside of the test room for sorting the IC devices that have been tested based on the test results. The sorting machine has a plurality of sort stations for receiving the IC devices based on categories defined in the test results. Tray cassettes hold a plurality of IC trays containing the IC devices, and both the tray cassettes and IC trays are provided with identification numbers. The trays are horizontally transferred on the testing machine and the sorting machine, and a data communication network connected between the testing machine and the sorting machine transmits the test results and position information of the IC devices in the IC trays.

23 Claims, 5 Drawing Sheets

AUTOMATIC TEST HANDLER SYSTEM FOR IC TESTER

FIELD OF THE INVENTION

This invention relates to an automatic test handler for an IC tester for automatically supplying IC devices to be tested to a test position of the IC tester and sorting the tested IC devices based on the test results, and more particularly, to an automatic test handler system in which a sorting machine is mechanically separated from a testing machine which is installed in a test room and the sorting machine and the testing machine are electrically connected by a data communication network.

BACKGROUND OF THE INVENTION

In testing IC devices, an automatic test handler is frequently used in combination with an IC tester to automatically provide IC devices (DUT) to be tested to a test position at a test head of the IC tester. There are generally two types of test handlers, a vertical transfer type handler wherein the IC devices to be tested are transferred in a vertical direction with their own gravities and a horizontal transfer type handler wherein IC devices placed on a tray or carrier module are transferred in a horizontal direction to the test position.

In a typical horizontal transfer type test handler, IC devices to be tested are aligned on a tray in a loading area and picked, one by one, and transferred to a test head of an IC tester and placed on a test socket or contactor of the test head by a pick and place mechanism or a movable arm of the test handler. The tested IC devices are taken out from the test head and transferred to an unloading area. The tested IC devices are classified to two or more trays in a sorting area based on the test results.

Figure 5:
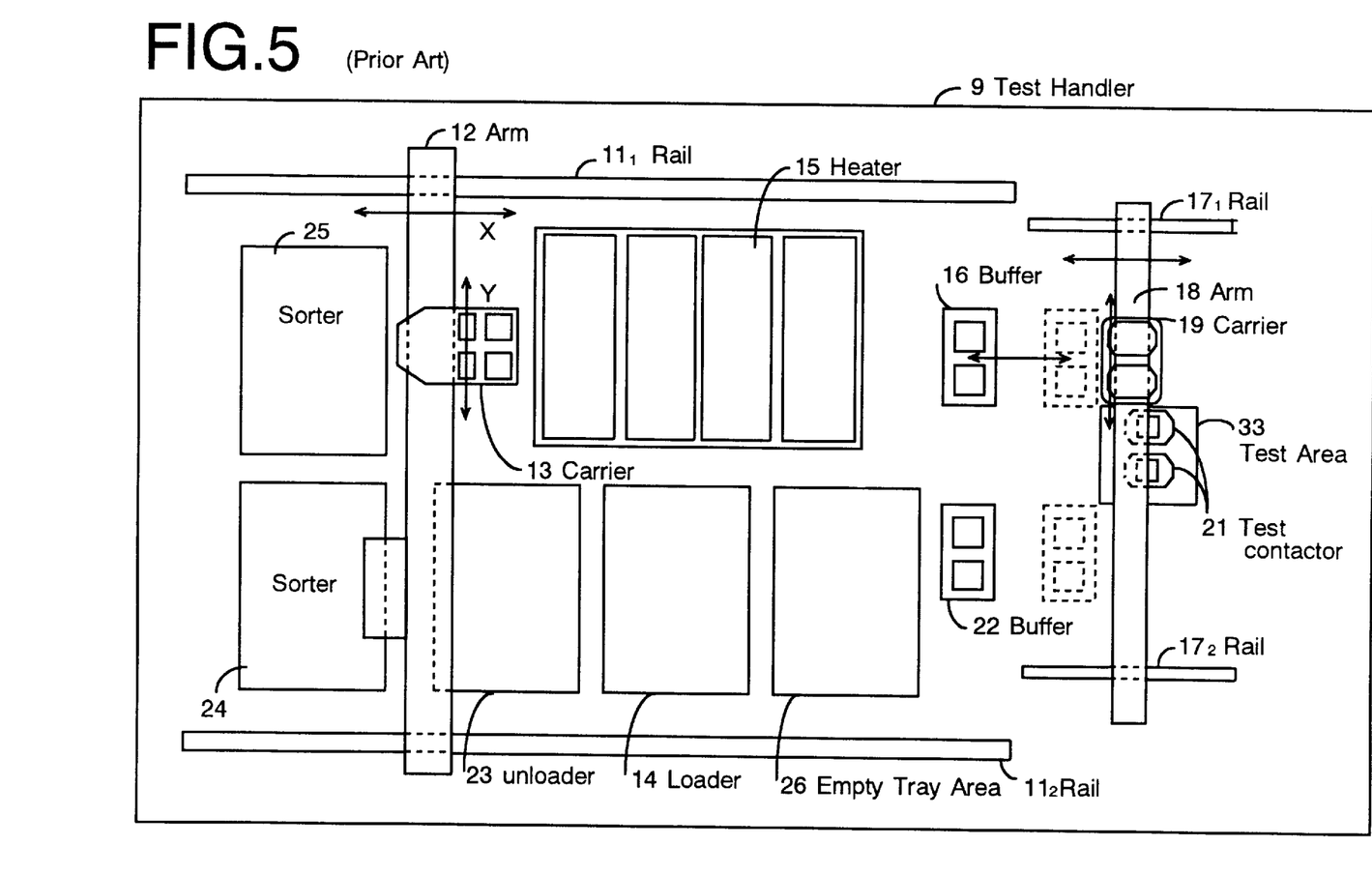
FIG. 5 is a plan view showing an example of structure in the conventional test handler used in combination with an IC tester.

Such a horizontal transfer type test handler is described in detail in a Japanese patent application No. 5-275570 filed by the same assignee of the present invention. FIG. 5 is a plan view showing the configuration of the conventional test handler disclosed in the Japanese patent application No. 5-275570.

In FIG. 5, a test handler 9 includes a movable arm 12 which is movably mounted on a pair of rails $11_1$ and $11_2$. The movable arm 12 moves on the rails $11_1$ and $11_2$ in a X direction on the surface of the test handler 9. On the movable arm 12, there is provided a movable carrier 13 which moves along the movable arm 12 in a Y direction on the surface of the test handler 9. Thus, the movable carrier 13 can take any positions on the surface, i.e., the X-Y plane of the test handler 9 within the area determined by the rails $11_1$ and $11_2$ and the movable arm 12.

In the movable area of the carrier 13, a loader 14, an unloader 23, and an empty tray area 26 are provided as well as a heater area 15. Sorters 24 and 25 are also provided in the movable area of the movable carrier 13. More sorters may be provided depending on the numbers of classification of the tested DUTs. In the right hand side of FIG. 5, within the movable area of the carrier 13, the test handler 9 includes buffers 16 and 22.

Another set of a movable arm and a movable carrier is used in a test area 33 of the test handler 9. A movable arm 18 is movably mounted on a pair of rails $17_1$ and $17_2$. The movable arm 18 moves on the rails $17_1$ and $17_2$ in a X direction on the surface of the teat handler 9. On the movable arm 18, there is provided a movable carrier 19 which moves along the movable arm 18 in a Y direction on the surface of the test handler 9. Thus, the movable carrier 19 can take any positions on the surface, i.e., the X-Y plane of the test handler 9 within the area determined by the rails $17_1$ and $17_2$ and the movable arm 12. A test contactor 21 is provided in the test area of the handler 9 which is connected to the IC tester.

In the loader 14, a plurality of trays 7 are piled in a tray cassette (not shown). Each of the trays 7 carries a plurality of DUTs 10 aligned thereon. The DUTs in the uppermost tray are taken out, one by one, or two or more at the same time, by the movable carrier 13. The DUTs are placed on the heater area 15, if necessary, to receive the heat for raising the inner temperature to a predetermined level. This heating process is commonly used in an automatic test handler to proceed a high temperature test for DUTs. A test handler may also include a cooler to perform a low temperature test.

The heated DUTs are then placed on the buffer 16 which moves in the X direction to the dotted line position in FIG. 5 in the test area 33. In the test area 33, the movable carrier 19 picks the DUT 10 on the buffer 16 and places the DUT on the test contactor 21. Although not shown, test signals from the IC tester are provided to the test contactor 21 and applied to the DUT 10. The resulting output signals from the DUT 10 are transmitted to the IC tester through the test contactor 21 to be evaluated by the IC tester by comparing them with expected data.

After the test, the DUT 10 is picked by the movable carrier 19 and placed on the buffer 22 which is positioned in the test area 33 as shown in the dotted line of FIG. 5. The buffer 22 returns to the original position where the movable carrier 13 is transferred to the unloader 23. In this example, when the DUT is non-defective, it is placed on the unloader 23, but if the DUT is defective, it is placed on the sorter 24 or 25 depending on the type of defects. The emptied trays in the loader 14 are shifted to the empty tray area 26.

As in the foregoing, the conventional automatic test handler 9 of FIG. 5 handles the DUTs 10 and transfers the DUTs to the test head of the IC tester to test various electric performances of the DUTs under the predetermined environmental conditions such as the high or low temperature. The DUTs are classified based on the test results, such as (1) conforming devices (2) defective devices or (3) devices need retest. If necessary, the defective devices are further classified depending on the causes of the defects.

Figure 6:
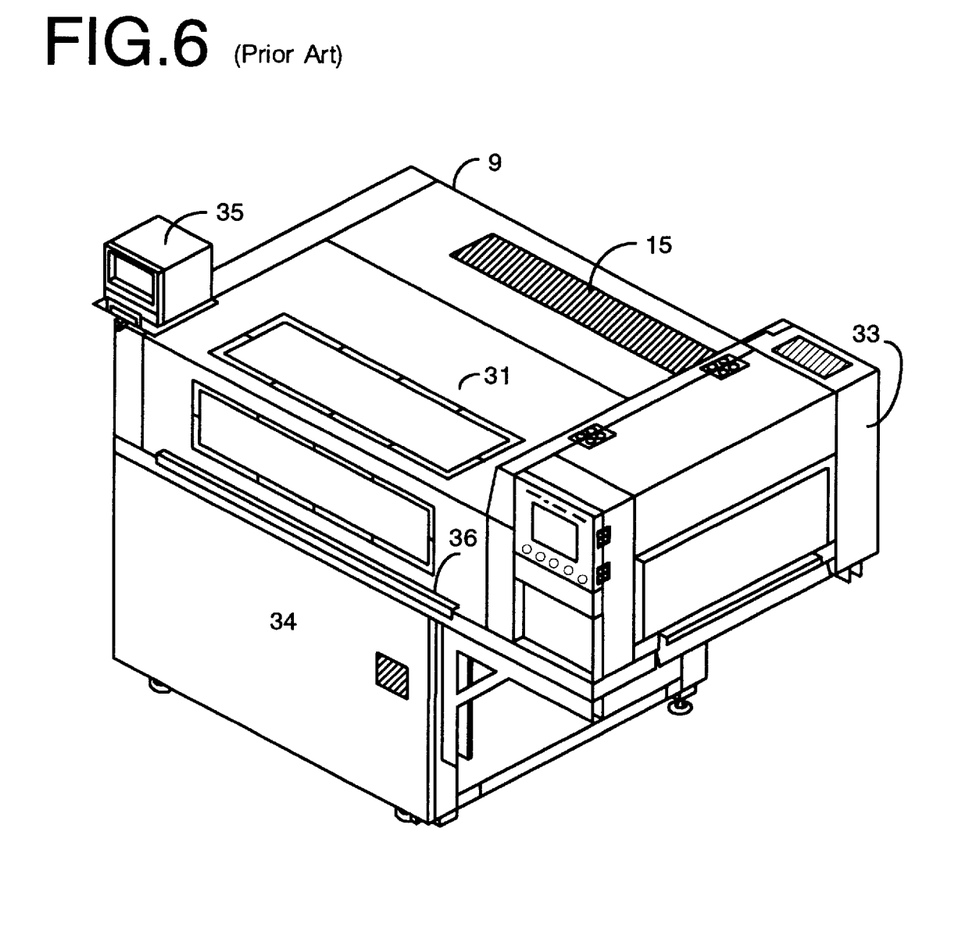
FIG. 6 is a perspective view of the conventional test handler of FIG. 5.

FIG. 6 is a schematic diagram showing a perspective view of the automatic test handler of FIG. 5 in which the parts corresponding to FIG. 5 are denoted by the same reference numerals. With reference to FIG. 6, the outer configuration of the automatic test handler for the IC tester is explained. Numeral 31 designates a loader and unloader. When opening the cover by a handle 36, there is shown the loader and unloader 31 wherein tray cassettes are respectively provided. A plurality of IC trays 7, for example more than twenty IC trays, are installed in each tray cassette. Each of the IC tray 7 carries, for example 50 or more DUTs, depending on the size of the DUT. Since the loader 14 has a capacity of 20–50 IC trays, 1000–3000 DUTs are installed in the loader 14 prior to the start of the test. As noted above, the DUTs are transferred horizontally over the surface of the test handler.

The heater 15 is used for testing the DUTs under the high temperature. Numeral 33 designates the test area where the DUTs are placed on the test contactor. Although not shown, the test head of the IC tester is fixed to the opening provided under the test area 33. The test head of the IC tester and the test contactor in the test area 33 of the handler are electrically connected so that the DUT is provided with the test signals from the IC tester when placed on the test contactor. After the electrical test, there may be a visual test in which an outward appearance of the IC devices such as a shape, color, surface roughness and the like are tested. The DUTs are then proceeded to the sorting process based on the test results.

A control and power source 34 works as a system controller to control the operation of the test handler 9 as well as provide power to the test handler 9. A TV monitor 35 is to monitor the positioning between the DUT and the test contactor. By opening the cover with the handle 36, the surface of the test handler as shown in the plan view of FIG. 5 will be disclosed.

As shown in the foregoing example, the conventional test handler is integrally formed of the test area, the loader and unloader, and the sorting area. The IC tester and the automatic test handler are fixed together and installed in a special test room in, for example, a semiconductor production plant. The test room is a clean room in which temperature, humidity and dust of air are controlled in a degree higher than the ordinary factory. Since the recent semiconductor devices are complicated, miniaturized and high speed, such a clean room is necessary to fully evaluate the devices.

As a consequence, the cost per square meter of the test room is significantly higher than the other facilities in the semiconductor production plant. Because the floor space cost of the test room is high, the overall test cost of the IC devices becomes high. Thus, there is a need to effectively use the surface area of the test room to decrease the test cost of the IC devices.

The IC tester has been reduced in size by using high density electronics parts and by incorporating an improved electrical and mechanical design. However, since most of the functional blocks in the horizontal transfer type test handler are formed of mechanical parts, it is difficult to decrease the overall size of the test handler. For example, the size of the automatic test handler of FIGS. 5 and 6 is 180 cm by 106 cm in plan view, which is considered to be large relative to the size of the IC tester. Thus, the size of the automatic test handler tends to limit the reduction of the overall test cost, since it occupies a relatively large area of the test room.

Further, the time required for testing the DUTs in the test area and the time required for sorting the DUTs are usually different. For example, the testing time may be longer than the sorting time for specific kinds of DUTs or specific type of test. In other instances, the testing time may be shorter than the sorting time. In either case, the overall time required for the automatic test handler to evaluate the IC devices is determined by the slowest step. Thus, for example, even if an automatic test handler has an ability of high speed testing, the overall test efficiency is limited by the low speed of sorting.

Japanese Patent Publication No. 6-95125 discloses a structure of an automatic test handler in which a test area and a sorting area are mechanically separated. This technology includes an information storage which is attached to each tray cassette, an information write-in device for writing the position (coordinates) and the test results of each DUT in a tray in the information storage which is attached to the tray cassette, and an information read-out device for reading the data stored in the information storage attached to the tray cassette.

In this conventional example, the information for the DUTs is provided for every tray cassette. Thus, IC trays in the tray cassette are not identifiable from one another, which requires that the IC trays have to be strictly united to the tray cassette. In case where the order of the IC tray in the tray cassette has accidentally changed, the information regarding the DUTs becomes useless. Further, since all the test information of the DUTs in the tray cassette are stored in the information storage provided to the tray cassette, the volume of the information to be stored is limited by the capacity of the storage. Thus, there is a disadvantage in which the detailed test data, such as designations of the IC tester, test area and test sockets and the like are not available through the information storage.

SUMMARY OF THE INVENTION

It is therefore, an object of the present invention to provide an automatic test handler system in which a test machine and a sorting machine are separated so that only the testing machine is installed in a clean room while the testing machine and the sorting machine are connected by a data communication network.

It is another object of the present invention to provide an automatic test handler system which is capable of decreasing the needed surface area in a clean room occupied by the handler system so as to reduce the test cost of IC devices because the floor space cost of the clean room is high.

It is a further object of the present invention to provide an automatic test handler system which is capable of increasing the number of IC devices to be tested in a unit space of a clean room which requires a high space cost thereby improving the test efficiency.

It is a further object of the present invention to provide an automatic test handler system which is capable of optimizing the abilities of a testing machine and a sorting machine so as to maximize an overall test performance of the test handler system and an IC tester.

It is a further object of the present invention to provide an automatic test handler system which is capable of separately providing identification information on every IC tray and tray cassette.

To achieve these objectives, the test handler of the present invention has a structure in which a test area and a sorting area are mechanically separated so that the test area is installed in the clean room while the sorting area is positioned outside of the clean room. Each IC tray is provided with a data card showing identification data of the IC tray. The IC trays are installed in a tray cassette which is also provided with a data card indicating tray cassette identification data.

The test handler of the present invention includes:
a testing machine for testing the IC devices by contacting the IC devices with test contactors whereby providing test signals from the IC tester to the IC devices and receiving resulted signals from the IC devices, wherein the testing machine is installed in a test room in which dust, temperature and humidity are controlled in a high degree, a sorting machine installed outside of the test room for sorting the IC devices that have been tested based on the test results wherein the sorting machine has a plurality of sort stations for receiving the IC devices based on categories defined in the test results, a tray cassette for installing the plurality of IC trays containing the IC devices wherein the tray cassette is provided with a tray cassette identification number, each of the IC tray is provided with an IC tray identification number and is horizontally transferred on the testing machine and the sorting machine, and a data communication network connected between the testing machine and the sorting machine for transmitting data showing the test results and position information of each of the IC devices in the IC trays.

According to the automatic test handler system of the present invention, the testing machine and the sorting machine are mechanically separated from one another so that only the testing machine is installed in the test room while the testing machine and the sorting machine are electrically connected by the data communication network. Therefore, the automatic test handler system of the present invention is capable of decreasing a necessary surface area in the test room, which is a clean room whose space cost is very high, resulting in the reduction of the overall test cost of the IC devices.

In other words, for the same surface area of the test room, more testing machines can be installed. Thus, the automatic test handler system of the present invention is capable of increasing the number of IC devices to be tested in the clean room thereby improving the test efficiency and decreasing the test cost. Furthermore, the automatic test handler system of the present invention is capable of optimizing the abilities of the testing machine and the sorting machine so as to maximize an overall test performance of the test handler system and an IC tester.

The automatic test handler system includes a plurality of IC trays each of which carries a large number of IC devices. The IC trays are installed in the tray cassette which is transferred between the testing machine and the sorting machine. In the present invention, identification information is provided on each IC tray and on the tray cassette so that the identification information is read by an external data reader. Thus, even if the order of the IC trays is accidentally mixed-up failed, the testing operation or sorting operation of the IC devices on the IC tray can be continued without an error.

The test results and other information are transmitted through the data communication network which is governed by the host computer or the computer in the testing machine, there is no limitation of data capacity which will be found in the conventional technology.

DETAILED DESCRIPTION OF THE PREFERRED EMBODIMENTS

Figure 1:
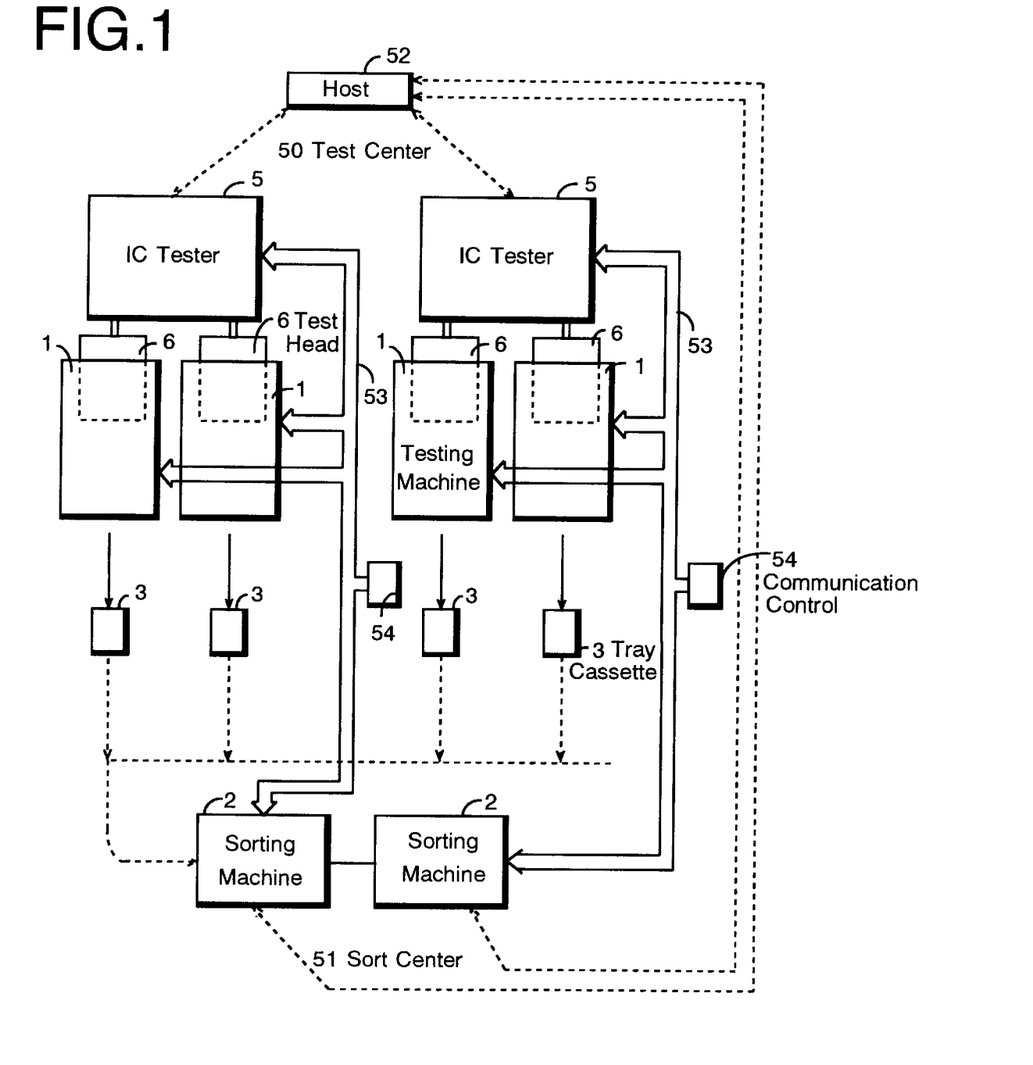
FIG. 1 is a schematic diagram showing a plan view of one of the examples of the automatic test handler system of the present invention in which two sets of IC tester and test handler system are included.

The preferred embodiment of the present invention will be described with reference to the drawings. FIG. 1 is a schematic diagram showing a plan view of an embodiment of the automatic test handler system of the present invention. In the example of FIG. 1, there is shown two sets of IC tester and test handler.

In the present invention, the test handler system has a structure in which a testing machine and a sorting machine are mechanically separated so that the testing machine is installed in a clean room (test room) while the sorting machine is positioned outside of the clean room. Each IC tray is provided with a data storage or data card to store data indicating an identification number of the IC tray. The IC trays are installed in a tray cassette which is also provided with a data card to store data indicating an identification number of the tray cassette.

Since the sorting machine is separated from the testing machine, the testing machine needs a smaller surface area of the clean room. For example, the testing machine has a size of 120 cm by 90 cm which is about a half of the conventional test handler. Thus, as in the example of FIG. 1, two testing machines may be connected to one IC tester in the same floor space that would be assigned to only one test handler of the conventional technology.

In FIG. 1, two IC testers 5 are provided in a test center 50, typically a clean room, for testing IC devices. Each IC tester 5 has two test heads 6 each of which is connected to a corresponding testing machine 1 of the handler system. As noted above, the two testing machines 1 occupy a space equivalent to one conventional test handler since the size of the testing machine is about 50% smaller than the conventional test handler.

Figure 4:
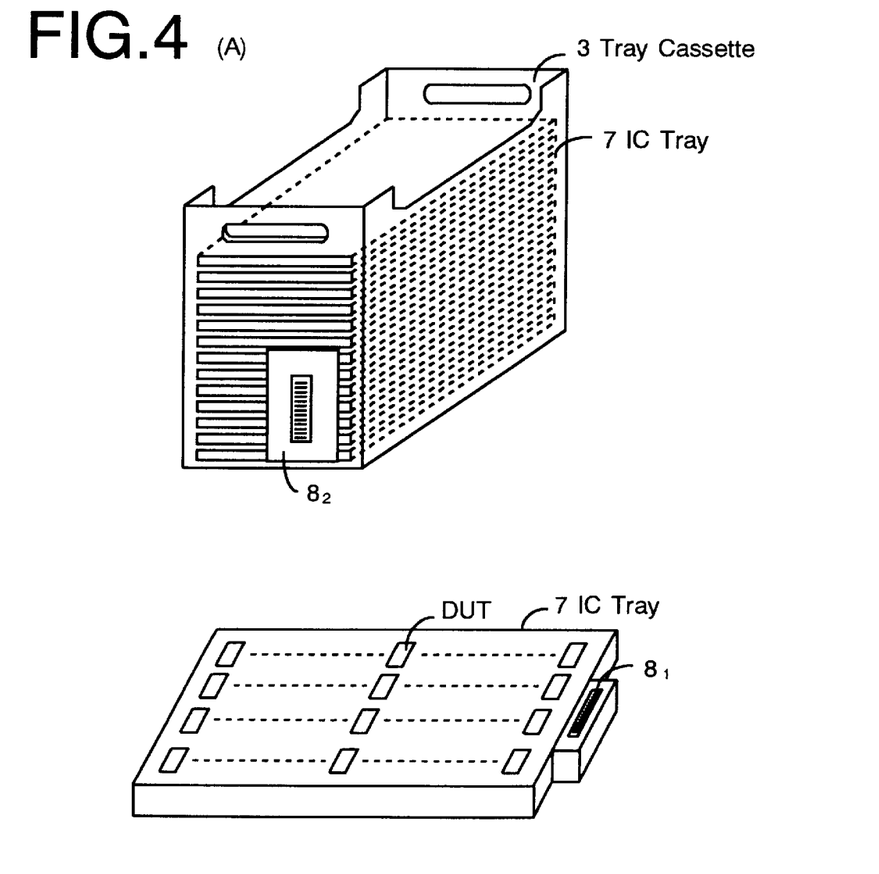
FIG. 4A is a perspective view showing an example of IC tray cassette in the present invention and FIG. 4B is a perspective view showing an example of IC tray in the present invention.

Sorting machines 2 are provided in a sort center which is typically in a semiconductor plant but outside of the clean room. With reference to FIGS. 4A and 4B, IC devices to be tested by the IC testers 5 and the testing machines 1 are aligned on IC trays 7. The IC trays 7 are installed in tray cassettes 3 which are transferred to the sorting machines 2 by a robot carrier or a belt conveyer and the like. The IC testers 5, the testing machines 1 and the sorting machines are connected through a data communication network 53 which is controlled by a data communication controller 54. Further, to establish operational control of the overall test system, the IC testers 5 and the sorting machines 2 are connected to a host computer 52.

Figure 2:
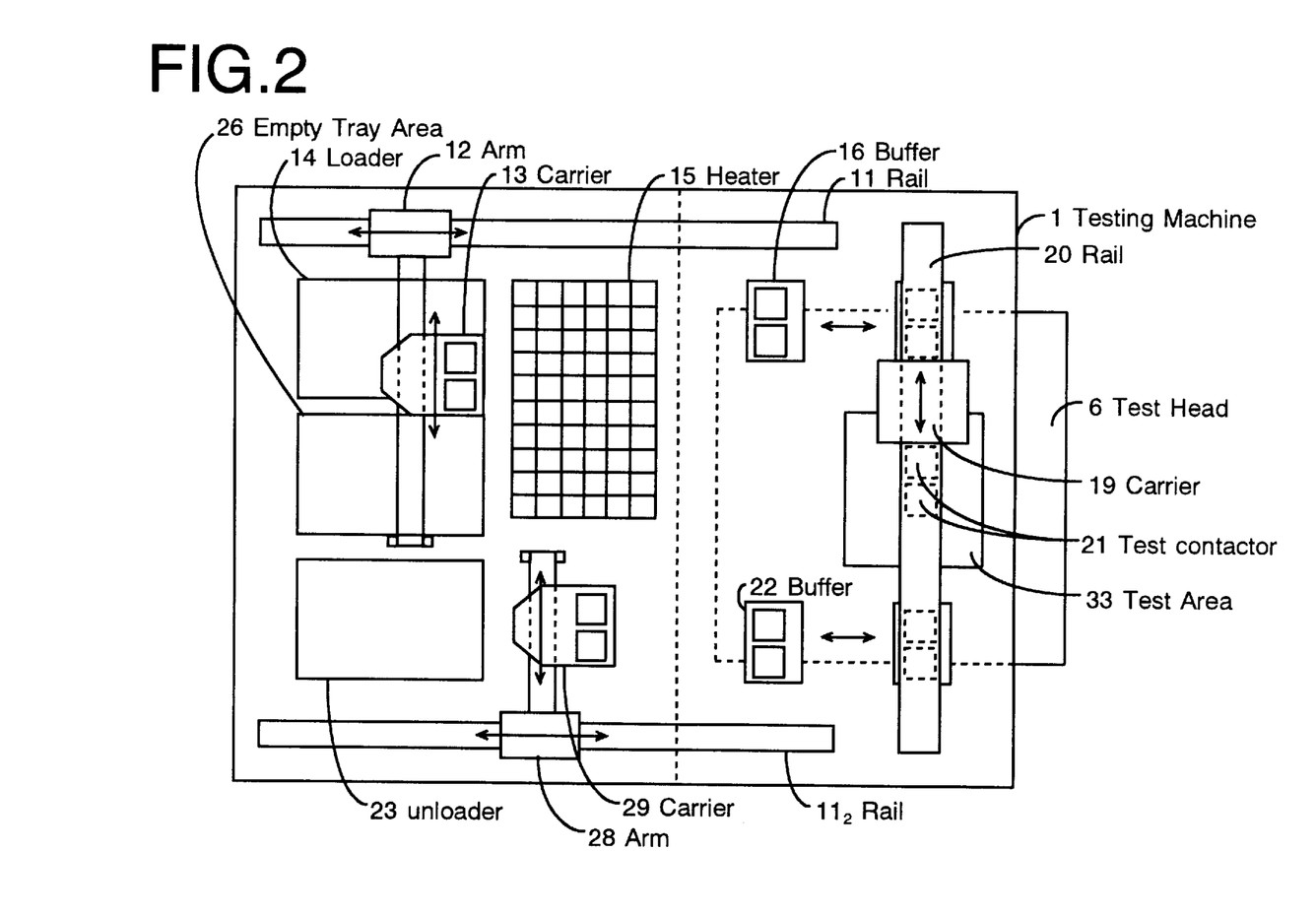
FIG. 2 is a schematic view showing a plan view of the testing machine in the automatic test handler system of the present invention of FIG. 1.

FIG. 2 shows a plan view of the testing machine 1 in the automatic test handler system of FIG. 1. In FIG. 2, the testing machine 1 includes a movable arm 12 which is movably mounted on a rail $11_1$ at its one end. The other end of the movable arm 12 may be slidably guided in a guide groove (not shown) on the surface of the testing machine. A movable arm 28 is mounted on a rail $11_2$ at its one end. The other end of the movable arm 28 may be slidably guided in a guide groove (not shown) on the surface of the testing machine. The movable arms 12 and 28 move on the rails $11_1$ and $11_2$, respectively, in the X direction on the surface of the testing machine 1.

On the movable arm 12, there is provided a movable carrier 13 which moves along the movable arm 12 in the Y direction on the surface of the testing machine 1. Similarly, on the movable arm 28, there is provided a movable carrier 29 which moves along the movable arm 28 in the Y direction on the surface of the testing machine 1. Thus, the movable carriers 13 and 29 can take any positions on the surface, i.e., the X-Y plane of the testing machine 1 within the area determined by the rails $11_1$ and $11_2$ and the movable arms 12 and 28. In the movable area of the carrier 13, a loader 14 and an empty tray area 26 are provided as well as a heater area 15 and a buffer 16. In the movable area of the carrier 29, an unloader 23 and a buffer 22 are provided.

A movable carrier 19 is mounted on a rail 20 which is oriented in the Y direction. The movable carrier 19 moves on the rail 20 in the Y direction on the surface of the testing machine 1. The test head 6 of the IC tester 5 is positioned under the testing machine 1 such that a test area 33 of the testing machine contacts with the test head 6. The test area 33 includes test contactors 21 which receive the IC devices to be tested. Preferably, the rail 20 is so positioned that its center comes right above the test contactors 21. The buffers 16 and 22 move in the X direction from the positions in the moving areas of the movable carriers 12 and 29 to the positions under the rail 20 as shown by the dotted lines in FIG. 2.

The testing machine starts testing IC devices after being provided with the tray cassettes 3 in the loader 14 of the testing machine 1. The tray cassette 3 includes several ten IC trays 7 each of which carries a large number of IC devices to be tested. Each of the tray cassette 3 and the IC trays 7 has a data card at its outside to be readable by an external data reader. The data card includes an identification number of the corresponding tray cassette or the IC tray. The identification number may be expressed, typically by a bar code to be easily read by an opto-electronic reader. However, other types of data card or means to express identity, such as using a magnetic material, an optical device or mechanical holes or grooves can also be applicable to the present invention.

The DUTs 10 in the uppermost IC tray 7 are taken out, one by one, or two or more at a time, by the movable carrier 13. The DUTs 10 are placed on the heater area 15, if necessary, to receive the heat for raising the inner temperature of the DUTs to a predetermined level. The testing machine may also include a cooler to undertake a low temperature test. The IC trays 7 which are now empty are transferred to the unloader 23 to receive the DUTs that have been tested.

The DUTs 10 heated by the heater 15 are then placed on the buffer 16 which moves in the X direction to a dotted line position right under the rail 20 in the test area 33. In the test area 13, the movable carrier 19 picks the DUT 10 on the buffer 16 and places the DUT on the test contactor 21. Although not shown, test signals from the IC tester are provided to the test contactor 21 through the test head 6 and applied to the DUT 10. The resulting output signals from the DUT 10 are transmitted to the IC tester through the test contactor 21 and the test head 6 to be evaluated by the IC tester 5 by being compared with expected data generated by the IC tester 5.

After the test, the DUT 10 is picked from the test contactor 21 by the movable carrier 19 and placed on the buffer 22 which is positioned right under the rail 20 in the test area 33 as shown in the dotted line. The buffer 22 returns to the original position so that the movable carrier 29 will take the tested DUTs and transfer them to the unloader 23. In the unloader 23, the tested DUTs are placed on the IC trays 7. The IC trays 7 having the tested DUTs are stocked in the tray cassette 3 (FIG. 4A).

Various test data including a position of each DUT in the IC tray 7, test categories and fail categories of the DUTs, identification numbers of the IC trays 7, and identification numbers of the tray cassette 3 is stored in the host computer 52 of FIG. 1 or computers (not shown) in the testing machines 1. The test data is transferred to the sorting machine 2 through the data communication network 53 to proceed sorting operations in the sorting machine 2.

Figure 3:
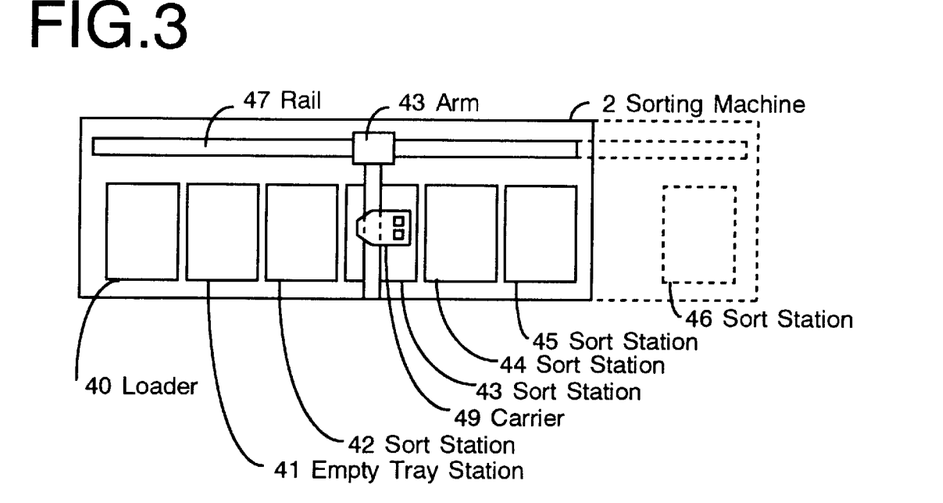
FIG. 3 is a schematic view showing a plan view of the sorting machine in the automatic test handler system of the present invention of FIG. 1.

FIG. 3 shows a plan view of the sorting machine in the automatic test handler system of the present invention. As noted above, the sorting machine 2 will be installed in the area other than the expensive clean room. Thus, the spacing for the sorting machine is not a big concern in decreasing the test cost of the IC devices. As a consequence, the sorting machine 2 may include many sort stations so that the tested IC devices can be classified into various test categories and fail categories. The numbers of the sort stations may be determined by taking the speeds of the testing machine 1 and the sorting machine 2 into account to maximize the overall test efficiency.

The sorting machine in FIG. 3 includes a loader 40, an empty tray station 41, sort stations 42–46, a rail 47, a movable arm 48 and a movable carrier 49. The rail 47 extends in an area proximate to the loader 40, the empty tray station 41 and all of the sort stations 42–46. The movable arm 48 moves along the rail 47 on the surface of the sorting machine 2. The movable carrier 49 moves along the movable arm 48 which is perpendicular to the rail 47. Thus, the movable carrier 49 can take any positions on the surface, i.e., the X-Y plane of the sorting machine 2 under which the loader 40, the empty tray station 41 and all of the sort stations 42–46 are provided.

In this arrangement, the sorting operation starts when the tray cassette 3 having the IC trays filled with the tested DUTs is inserted in the loader 40. The data showing the test results are transmitted from the host computer 52 or the computers in the testing machines 1 through the data communication network 53 to the sorting machine 2. Thus, the sorting operation is performed based on the data from the communication network 53.

Prior to actually classifying the tested DUTs, the identification numbers of the IC trays 7 and the tray cassette 3 are read by the data reader (not shown) in the sorting machine. Such identification numbers are confirmed based on the data from the testing machine 1 through the data communication network 53. Then the DUTs are distributed to the corresponding sort stations 42–46 based on the test results and the position data provided through the data communication network 53 for each DUT in the IC tray 7.

Because the sorting machine of the present invention can include more sort stations than the conventional technology, the sorting operation with higher flexibility is available such as larger numbers of classification categories. Further, an optimum overall testing speed may be available by adjusting the number of sort stations when there is a difference between the testing speed in the testing machine 1 and the sorting speed in the sorting machine 2.

FIG. 4A is a perspective view showing an example of the IC tray cassette 3 in the present invention and FIG. 4B is a perspective view showing an example of the IC tray 7 in the present invention. The tray cassette 3 has an identification (ID) number $8_2$ and the IC tray 7 has an identification (ID) number $8_1$ to be readable from their outside surfaces by an external data reader. Preferably, the ID number $8_2$ on the tray cassette 3 is automatically read by the testing machine 1 or the sorting machine 2 when the tray cassette is inserted in the loader 14 (testing machine) or the loader 40 (sorting machine), respectively.

As noted above, the IC trays 7 having IC devices to be tested are installed in the tray cassette 3 which is loaded in the testing machine 1. During the test, the tray cassette 3 receives the IC trays 7 having IC devices that have been tested. After the test, the tray cassette 3 is transferred to the sorting machine 2 wherein the tested IC devices are sorted according to the test results provided through the network 53. The ID number $8_1$ of the IC tray 7 is read by the testing machine 1 or the sorting machine 2 when the IC tray 7 comes to the uppermost position in the cassette tray 3 at the loaders 14 and 40.

As has been described, according to the automatic test handler system of the present invention, a testing machine and a sorting machine are mechanically separated from one another so that only the testing machine is installed in a test room while the testing machine and the sorting machine are electrically connected by a data communication network. Therefore, the automatic test handler system of the present invention is capable of decreasing a necessary surface area in the test room, which is a clean room whose space cost is very high, so as to reduce the overall test cost of the IC devices.

In other words, for the same surface area of the test room, more testing machines can be installed. Thus, the automatic test handler system of the present invention is capable of increasing the number of IC devices to be tested in the clean room thereby improving the test efficiency and decreasing the test cost. Furthermore, the automatic test handler system of the present invention is capable of optimizing the abilities of the testing machine and the sorting machine so as to maximize an overall test performance of the test handler system and an IC tester.

The automatic test handler system includes a plurality of IC trays each of which carries a large number of IC devices. The IC trays are installed in the tray cassette which is transferred between the testing machine and the sorting machine. In the present invention, identification information is provided on each IC tray and on the tray cassette so that the identification information is read by an external data reader. Thus, even if the order of the IC trays is accidentally mixed-up, the testing operation or sorting operation of the IC devices on the IC tray can be continued without an error.

The test results and other information are transmitted through the data communication network which is governed by the host computer or the computer in the testing machine, there is no limitation of data capacity which will be found in the conventional technology.

What is claimed is:

1. An automatic test handler system for handling IC devices for testing the IC devices by an IC tester and sorting the tested IC devices based on the test results, comprising:

a testing machine for testing said IC devices by contacting said IC devices with test contactors whereby providing test signals from said IC tester and receiving resulted signals from said IC devices, said testing machine being installed in a clean room environment wherein dust, temperature and humidity are controlled in a high degree, said testing machine having a loader for loading a plurality of IC trays each of which carries a plurality of IC devices to be tested, a test area having said test contactors, an unloader for receiving IC devices that have been tested on an empty IC tray, and a test controller for controlling an overall operation of said testing machine;

a sorting machine installed outside of said clean room environment for sorting said IC devices that have been tested based on said test results, said sorting machine having a loader for loading a plurality of said IC trays transferred from said unloader of said testing machine, a plurality of sorting stations for receiving said IC devices based on categories defined in said test results and a sort controller for controlling an overall operation of said sorting machine;

a tray cassette for installing said plurality of IC trays containing said IC devices to be tested and loading said IC trays in said loader of said testing machine and for receiving said IC trays carrying said IC devices that have been tested at said unloader of said testing machine, said tray cassette being transferred to said loader of said sorting machine prior to sorting said IC devices, said tray cassette being provided with a tray cassette identification number;

each of said IC tray is provided with an IC tray identification number, said IC trays being horizontally transferred on said testing machine and said sorting machine; and a data communication network connected between said testing machine and said sorting machine for transmitting said test results and position information of said IC devices in said IC trays and said identification numbers, wherein said data communication network transmits said test results and said position information and said identification numbers from said test controller in said testing machine to said sort controller in said sorting machine.

2. An automatic test handler system as defined in claim 1, wherein said sorting machine reads said tray cassette identification number when said tray cassette having tested IC devices is loaded in said loader of said sorting machine, said sorting machine confirming said tray cassette identification number with said identification numbers received through said data communication network.

3. An automatic test handler system as defined in claim 1, wherein said sorting machine reads said IC tray identification number of an IC tray in an uppermost position of said tray cassette when said tray cassette is loaded in said loader of said sorting machine, said sorting machine confirming said IC tray identification number with said identification numbers received through said data communication network.

4. An automatic test handler system as defined in claim 1, wherein said IC tray is emptied in said loader of said testing machine and transferred to said unloader of said testing machine to receive said IC devices that have been tested.

5. An automatic test handler system as defined in claim 1, wherein said testing machine includes a movable arm and a movable carrier to pick and place said IC devices within an area defined by said movable arm and said movable carrier.

6. An automatic test handler system as defined in claim 1, wherein said test contactors in said testing machine are connected to a test head of said IC tester to provide said test signals from said IC tester to said IC devices and to transmit said resulted signals from said IC devices to said IC tester.

7. An automatic test handler system as defined in claim 1, wherein said sorting machine includes a movable arm and a movable carrier to pick and place said IC devices within an area defined by said movable arm and said movable carrier.

8. An automatic test handler system as defined in claim 1, wherein said identification numbers of said tray cassette and said IC tray are bar codes to be read by a bar code reader.

9. An automatic test handler system for handling IC devices for testing the IC devices by an IC tester and sorting the tested IC devices based on the test results, comprising:

a testing machine for testing said IC devices by contacting said IC devices with test contactors whereby providing test signals from said IC tester and receiving resulted signals from said IC devices, said testing machine being installed in a clean room environment wherein dust, temperature and humidity are controlled in a high degree, said testing machine having a loader for loading a plurality of IC trays each of which carries a plurality of IC devices to be tested, a test area having said test contactors, an unloader for receiving IC devices that have been tested on an empty IC tray, and a test controller for controlling an overall operation of said testing machine and for providing test results of said IC devices to a host computer;

a sorting machine installed outside of said clean room environment for sorting said IC devices that have been tested based on said test results, said sorting machine having a loader for loading a plurality of said IC trays transferred from said unloader of said testing machine, a plurality of sorting stations for receiving said IC devices based on categories defined in said test results and a sort controller for controlling an overall operation of said sorting machine and for receiving said test results from said host computer;

a tray cassette for installing said plurality of IC trays containing said IC devices to be tested and loading said IC trays in said loader of said testing machine and for receiving said IC trays carrying said IC devices that have been tested at said unloader of said testing machine, said tray cassette being transferred to said loader of said sorting machine prior to sorting said IC devices, said tray cassette being provided with a tray cassette identification number;

each of said IC tray is provided with an IC tray identification number, said IC trays being horizontally transferred on said testing machine and said sorting machine; and a data communication network connected between said testing machine and said sorting machine for exchanging data regarding said test results, position information of said IC devices in said IC trays and said identification numbers, said host computer controlling said exchanging data between said testing machine and said sorting machine, wherein said data communication network sends said test results and said position information and said identification numbers from said test controller in said testing machine to said sort controller in said sorting machine through said host computer.

10. An automatic test handler system as defined in claim 9, wherein said sorting machine reads said tray cassette identification number when said tray cassette having tested IC devices is loaded in said loader of said sorting machine, said sorting machine confirming said tray cassette identification number with said identification numbers received through said data communication network.

11. An automatic test handler system as defined in claim 9, wherein said sorting machine reads said IC tray identification number of an IC tray in an uppermost position of said tray cassette when said tray cassette is loaded in said loader of said sorting machine, said sorting machine confirming said IC tray identification number with said identification numbers received through said data communication network.

12. An automatic test handler system for efficiently handling, testing, and sorting IC devices in the minimum amount of clean room space, comprising:

a plurality of trays each of which is adapted to hold a plurality of the IC devices;

a plurality of cassettes each of which is adapted to hold a plurality of the trays;

a testing machine installed in a clean room for testing the IC devices, the testing machine having a test area including a plurality of test contractors adapted to electrically connect with and test said IC devices, the testing machine further including a loader for loading said trays into proximity with the test area, and an unloader for receiving IC devices that have been tested and placing them in trays, the trays being positioned in cassettes;

a sorting machine installed outside of a clean room environment for sorting the IC devices that have been tested based on the test results;

a carrier for transferring the cassettes containing the trays having IC devices that have been tested from the unloader to the sorting machine;

a means for externally identifying each cassette and each tray; and a controller for controlling an overall operation of the testing machine, loader, unloader, and sorting machine, the controller being supplied with information from the testing machine with regard to the test results of each IC device within each tray, the system further including at least one device for recognizing the means for externally identifying each cassette and each tray and communicating with the controller, the controller therefore monitoring the position of each tray and cassette, and communicating the test results of each IC device to the sorting machine via a data communication network.

13. An automatic test handler system as defined in claim 12, wherein the means for externally identifying each cassette and each tray comprises tray identification numbers and cassette identification numbers.

14. An automatic test handler system as defined in claim 13, wherein the device for recognizing the means for externally identifying each cassette and each tray comprises a bar reader.

15. An automatic test handler system as defined in claim 13, wherein said sorting machine includes a loader and reads said tray cassette identification number when said tray cassette having tested IC devices is loaded therein, said sorting machine confirming said tray cassette identification number with said identification numbers received through said data communication network.

16. An automatic test handler system as defined in claim 12, wherein said IC tray is emptied in said loader of said testing machine and transferred to said unloader of said testing machine to receive said IC devices that have been tested.

17. An automatic test handler system as defined in claim 12, wherein said carrier is a belt conveyor.

18. A method of testing IC devices, comprising:

placing a plurality of IC devices to be tested in a plurality of trays, each having a means for tray identification thereon;

placing a plurality of the trays with IC devices on a plurality of cassettes, each cassette having a means for cassette identification thereon;

transporting said cassettes with trays to a loader of a test machine, the test machine being installed in a clean room environment;

removing the IC devices individually from individual trays and transporting them into a test head of the test machine, and bringing test contactors into electrical engagement with each IC device;

testing each IC device with the test head;

communicating the test results for each IC device to a controller;

replacing the tested IC devices on the trays and the trays on the cassettes;

recording the location of each tested device with respect to the tray and cassette with which it is associated;

monitoring the position of each of the trays and each of the cassettes using the means for tray identification and the means for cassette identification, respectively;

transporting cassettes containing trays of tested IC devices outside of the clean room environment to a sorting machine while continuing the step of testing IC devices;

communicating to the sorting machine the information regarding the position of each of the trays and each of the cassettes and the location of each tested device with respect to the tray and cassette with which it is associated; and sorting the tested IC devices with the sorting machine based on their test responses.

19. The method of claim 18, wherein the step of monitoring comprises externally reading the means for tray identification and the means for cassette identification.

20. The method of claim 19, wherein the means for tray identification and the means for cassette identification comprise bar codes, and the step of reading is carried out with a bar code reader.

21. The method of claim 18, wherein the step of transporting cassettes containing trays of tested IC devices outside of the clean room environment to a sorting machine is accomplished with a conveyor.

22. The method of claim 18, wherein the steps of removing and replacing are accomplished using pick and place arms.

23. The method of claim 18, wherein the step of sorting is accomplished using pick and place arms.

* * * * *